United States Patent
Park et al.

(10) Patent No.: US 9,117,692 B2
(45) Date of Patent: Aug. 25, 2015

(54) SEMICONDUCTOR DEVICE HAVING DUAL METAL SILICIDE LAYERS AND METHOD OF MANUFACTURING THE SAME

(71) Applicant: Samsung Electronics Co., Ltd., Suwon-si (KR)

(72) Inventors: Sangjine Park, Yongin-si (KR); Boun Yoon, Seoul (KR); Jeongnam Han, Seoul (KR); Kee-Sang Kwon, Seoul (KR); Byung-Kwon Cho, Suwon-si (KR); Wonsang Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/513,807

(22) Filed: Oct. 14, 2014

(65) Prior Publication Data

US 2015/0028423 A1    Jan. 29, 2015

Related U.S. Application Data

(63) Continuation of application No. 14/083,654, filed on Nov. 19, 2013, now Pat. No. 8,889,552.

(30) Foreign Application Priority Data

Mar. 4, 2013   (KR) .................. 10-2013-0022931

(51) Int. Cl.
*H01L 21/70* (2006.01)
*H01L 27/092* (2006.01)
(Continued)

(52) U.S. Cl.
CPC ...... *H01L 27/092* (2013.01); *H01L 21/823807* (2013.01); *H01L 21/823814* (2013.01); *H01L 21/823871* (2013.01); *H01L 29/161* (2013.01); *H01L 29/4175* (2013.01); *H01L 29/45* (2013.01); *H01L 29/495* (2013.01); *H01L 29/4966* (2013.01); *H01L 29/517* (2013.01)

(58) Field of Classification Search
CPC .............. H01L 21/823871; H01L 21/823807; H01L 21/823814; H01L 29/517; H01L 29/41725
USPC ......... 257/377, 343, 382, 383, 384, 774, 757, 257/288; 438/630, 664, 672, 675, 233, 300, 438/655, 682, 231
See application file for complete search history.

(56) References Cited

U.S. PATENT DOCUMENTS

| 7,112,481 B2 | 9/2006 | Fang et al. |
| 7,465,634 B2 | 12/2008 | Lim et al. |

(Continued)

FOREIGN PATENT DOCUMENTS

JP    2012019004    1/2012

OTHER PUBLICATIONS

"Semiconductor Device Having Dual Metal Silicide Layer and Method of Manufacturing the Same" Specification, Drawings, Claims and Prosecution History, of U.S. Appl. No. 14/083,654, filed Nov. 19, 2013. by Sangjine Park, et al.

*Primary Examiner* — Thanh Y Tran
(74) *Attorney, Agent, or Firm* — Onello & Mello, LLP

(57) ABSTRACT

A semiconductor device is manufactured using dual metal silicide layers. The semiconductor device includes a substrate having first and second regions, a first metal gate electrode on the substrate in the first region, a second metal gate electrode on the substrate in the second region, a first epitaxial layer on and in the substrate at both sides of the first metal gate electrode, a second epitaxial layer on and in the substrate at both sides of the second metal gate electrode, a first metal silicide layer on the first epitaxial layer, a second metal silicide layer on the second epitaxial layer, an interlayer dielectric layer on the first and second metal silicide layers, contact plugs passing through the interlayer dielectric layer and electrically connected to the first and second metal silicide layers.

12 Claims, 20 Drawing Sheets

(51) Int. Cl.
  *H01L 21/8238* (2006.01)
  *H01L 29/161* (2006.01)
  *H01L 29/417* (2006.01)
  *H01L 29/45* (2006.01)
  *H01L 29/49* (2006.01)
  *H01L 29/51* (2006.01)

(56) References Cited

U.S. PATENT DOCUMENTS

| | | |
|---|---|---|
| 7,514,753 B2 | 4/2009 | Tsuchiya et al. |
| 8,247,279 B2 | 8/2012 | Okamoto |
| 8,288,825 B2 | 10/2012 | Chong et al. |
| 2009/0321841 A1 | 12/2009 | Hoentschel et al. |
| 2010/0123198 A1* | 5/2010 | Kim et al. ............ 257/377 |
| 2011/0254054 A1 | 10/2011 | Itou |
| 2012/0056245 A1* | 3/2012 | Kang et al. ............ 257/192 |
| 2012/0171826 A1 | 7/2012 | Kim et al. |
| 2012/0171864 A1 | 7/2012 | Akiyama et al. |
| 2012/0178231 A1 | 7/2012 | Kim et al. |
| 2012/0231632 A1 | 9/2012 | Takahashi et al. |
| 2012/0241868 A1 | 9/2012 | Tsai et al. |
| 2012/0256266 A1 | 10/2012 | Itou et al. |
| 2013/0015522 A1 | 1/2013 | Kutsunai et al. |
| 2014/0191298 A1 | 7/2014 | Chen et al. |

* cited by examiner

SEMICONDUCTOR DEVICE HAVING DUAL METAL SILICIDE LAYERS AND METHOD OF MANUFACTURING THE SAME

CROSS-REFERENCE TO RELATED APPLICATIONS

This application is a continuation application of U.S. patent application Ser. No. 14/083,654, filed on Nov. 19, 2013, which claims the benefit of Korean patent application number 10-2013-0022931, filed on Mar. 4, 2013 in the Korean Intellectual Property Office (KIPO), the contents of which are herein incorporated by reference in their entirety.

TECHNICAL FIELD

The present inventive concepts relate to a semiconductor device having dual metal silicide layers and a method of manufacturing the same. According to the present inventive concepts, the semiconductor device may comprise NMOS and PMOS transistors having source and drain regions, respectively. The NMOS and PMOS transistors of the present inventive concepts may have metal silicide layers on the source and drain regions.

BACKGROUND

A semiconductor device may have contact plugs formed on source and drain regions of NMOS and PMOS transistors, respectively. In order to increase the performance and reliability of the semiconductor device, contact resistance of the contact plugs may be reduced by forming silicide layers on the source and drain regions of the NMOS and PMOS transistors.

SUMMARY

The present inventive concepts provide a semiconductor device having dual metal silicide layers and a method of manufacturing the same.

According to an aspect of the present inventive concepts, there is provided a semiconductor device including a substrate having first and second regions; a first metal gate electrode on the substrate in the first region; a second metal gate electrode on the substrate in the second region; a gate dielectric layer between the first and second metal gate electrodes and the substrate; a first epitaxial layer on and in the substrate at both sides of the first metal gate electrode; a second epitaxial layer on and in the substrate at both sides of the second metal gate electrode; a first metal silicide layer having a first width on the first epitaxial layer; a second metal silicide layer having a second width on the second epitaxial layer; an interlayer dielectric layer on the first and second metal silicide layers; a first contact plug passing through the interlayer dielectric layer and electrically connected to the first metal silicide layer; a second contact plug passing through the interlayer dielectric layer and electrically connected to the second metal silicide layer; a barrier metal layer between the first contact plug and the first metal silicide layer. The first metal silicide layer has at least one metal element different from that in the second metal silicide layer.

In some embodiments, the first region may be a PMOS transistor region and the second region is a NMOS transistor region.

In some embodiments, the gate dielectric layer may include at least one of hafnium (Hf), zirconium (Zr), and lanthanum (La). The first and second metal gate electrode layers may include at least one composition selected from the group consisting of titanium (Ti), titanium nitride (TiN), tantalum (Ta), tantalum nitride (TaN), tantalum aluminum carbon compound (TaAlC), tungsten (W), copper (Cu), and aluminum (Al).

In some embodiments, the semiconductor device may further comprise a first metal gate electrode capping layer on the first metal gate electrode and a second metal gate electrode capping layer on the second metal gate electrode. The first and second metal gate electrodes capping layers may include at least one of a silicon carbon (SiC) layer, a silicon carbon nitride (SiCN) layer, a silicon carbon oxynitride (SiCON) layer, a silicon oxynitride (SiON) layer, and a silicon nitride (SiN) layer.

In some embodiments, the semiconductor device may further comprise an etch stop layer between the interlayer dielectric layer and the first and second metal silicide layer.

In some embodiments, the uppermost surface of the first epitaxial layer may be at a higher level than the uppermost surface of the substrate adjacent the first epitaxial layer.

In some embodiments, the first epitaxial layer may include germanium (Ge).

In some embodiments, the first epitaxial layer may have three portions including a lower portion, a middle portion, and upper portion. The lower portion may include silicon (Si), boron (B), and germanium (Ge). The middle portion may include silicon (Si) and germanium (Ge). The upper portion may include silicon (Si).

In some embodiments, the first metal silicide layer may include at least one of nickel (Ni), platinum (Pt), and cobalt (Co) and the second metal silicide layer may include titanium (Ti).

In some embodiments, the first metal silicide layer may include at least one of a nickel platinum silicon compound (NiPtSi) and a nickel cobalt silicon compound (NiCoSi) and the second metal silicide layer may include a titanium silicon compound (TiSi).

In some embodiments, the semiconductor device may further comprise gate spacers on sidewalls of the first and second metal gate electrodes.

In some embodiments, the second width of the second metal silicide layer may be narrower than the first width of the first metal silicide layer.

In accordance with another aspect of the present inventive concepts, provided is a method of manufacturing a semiconductor device which may include providing a substrate having PMOS and NMOS transistor regions; forming a first metal gate electrode on the substrate in the PMOS transistor region; forming a second metal gate electrode on the substrate in the NMOS transistor region; forming first and second metal gate electrode capping layers on the first and second metal gate electrodes, respectively; forming a first epitaxial layer on and in the substrate at both sides of the first metal gate electrode; forming a second epitaxial layer on and in the substrate at both sides of the second metal gate electrode; forming a first metal silicide seed layer on the first epitaxial layer and on the first metal gate electrode capping layer; forming a first metal silicide capping layer on the first metal silicide seed layer; forming a second metal silicide seed layer on the second epitaxial layer and on the first metal silicide capping layer; performing a heat-treatment process to form first and second metal silicide layers on the first and second epitaxial layers, respectively; removing the first metal silicide seed layer, the first metal silicide capping layer and the second metal silicide seed layer; forming an interlayer dielectric layer on the PMOS and NMOS transistor regions; forming a first contact plug passing through the interlayer dielectric layer and electrically connected to the first metal silicide layer; and forming a second contact plug passing through the interlayer dielectric layer and electrically connected to the second metal silicide layer. The first metal silicide layer has at least one metal element different from that in the second metal silicide layer.

In some embodiments, the method of forming the first and second metal gate electrode capping layers may comprise forming a sacrificial layer on the substrate; forming a first dummy gate pattern having sidewalls and an upper surface on the sacrificial layer in the PMOS transistor region; forming a second dummy gate pattern having sidewalls and an upper surface on the sacrificial layer in the NMOS transistor region; forming spacers on the sidewalls of the first and second dummy gate patterns; forming a second interlayer dielectric layer on the first and second dummy gate patterns; planarizing the second interlayer dielectric layer to expose the upper surface of the first and second dummy gate patterns; forming first and second trenches to expose an upper surface of the substrate by removing the first and second dummy gate patterns and the sacrificial layer respectively; forming a gate dielectric layer on sidewalls and at bottoms of the first and second trenches; forming first and second metal gate electrode layers in the first and second trenches, respectively; and forming first and second metal gate electrode capping layers in the first and second trenches and on the first and second metal gate electrode layers, respectively.

In some embodiments, the method of forming the first and second epitaxial layers may comprise forming a first etch stop layer on the first dummy gate pattern in the PMOS transistor region; forming a first recess region at both sides of the second dummy gate pattern using the first etch stop layer as an etching mask, the first recess region being in the substrate of the NMOS transistor region; forming a second epitaxial layer in the first recess region; removing the first etch stop layer; forming a second etch stop layer on the second epitaxial layer and on the second dummy pattern in the NMOS transistor region; forming a second recess region at both sides of the first dummy gate pattern using the second etch stop layer as an etching mask, the second recess region being in the substrate of the PMOS region; and forming a first epitaxial layer in the second recess region.

In some embodiments, the method of removing the first and second metal silicide seed layers may comprise removing the first metal silicide seed layer using a chemical solution comprising nitric acid, hydrochloric acid and deionized water; and removing the second metal silicide seed layer using a chemical solution comprising sulfuric acid, hydrogen peroxide, deionized water, and ammonia.

In accordance with another aspect of the present inventive concepts, provided is a method of manufacturing a semiconductor device which may include providing a substrate having first and second regions; forming a first metal gate electrode on the substrate in the first region; forming a second metal gate electrode on the substrate in the second region; forming first and second metal gate electrode capping layers on the first and second metal gate electrodes, respectively; forming a first epitaxial layer on and in the substrate at both sides of the first metal gate electrode; forming a second epitaxial layer on and in the substrate at both sides of the second metal gate electrode; forming a protection layer on the second epitaxial layer; forming a first metal silicide seed layer on the first epitaxial layer and on the protection layer; forming a first metal silicide capping layer on the first metal silicide seed layer; performing a first heat-treatment process to form a first metal silicide layer on the first epitaxial layer; removing the first metal silicide capping layer, the first metal silicide seed layer, and the protection layer to expose the second epitaxial layer; forming a second metal silicide seed layer on the second epitaxial layer; and performing a second heat-treatment process to form a second metal silicide layer on the second epitaxial layer.

In some embodiments, the method of forming the second metal silicide seed layer may comprise forming the second metal silicide seed layer on the entire surfaces of the first and second regions thereby to cover the first metal silicide capping layer and the second epitaxial layer.

In some embodiments, the method may further comprise forming an interlayer dielectric layer on the first and second metal silicide layers; forming a first contact plug passing through the interlayer dielectric layer and electrically connected to the first metal silicide layer; and forming a second contact plug passing through the interlayer dielectric layer and electrically connected to the second metal silicide layer.

In some embodiments, the method may further comprise forming an interlayer dielectric layer on the entire surfaces of the first and second regions after removing the first metal silicide capping layer, the first metal silicide seed layer, and the protection layer. The method of forming the second metal silicide layer on the second epitaxial layer may comprise forming a contact hole having sidewalls and a bottom passing through the interlayer dielectric layer to partially expose a portion of the second epitaxial layer; forming the second metal silicide seed layer on the sidewalls and at a bottom of the contact hole; and forming the second metal silicide layer by performing the second heat-treatment process on the second epitaxial layer partially exposed at the bottom of the contact hole.

In accordance with another aspect of the present inventive concepts, provided is a method of manufacturing a semiconductor device which may include providing a substrate having first and second regions; forming a first metal gate electrode in the first region; forming a second metal gate electrode in the second region; forming a first epitaxial layer adjacent to the first metal gate electrode; forming a second epitaxial layer adjacent to the second metal gate electrode; forming a first metal silicide seed layer on the first epitaxial layer; forming a capping layer on the first metal silicide seed layer; forming a second metal silicide seed layer on the second epitaxial layer; forming a first metal silicide layers on the first epitaxial layer using a first heat-treatment process; forming a second metal silicide layer on the second epitaxial layer using a second heat-treatment process; removing the first metal silicide seed layer and the second metal silicide seed layer; forming an interlayer dielectric layer on the first and second metal silicide layers; forming a first contact plug passing through the interlayer dielectric layer and electrically connected to the first metal silicide layer; and forming a second contact plug passing through the interlayer dielectric layer and electrically connected to the second metal silicide layer.

In some embodiments, the second metal silicide seed layer comprises forming the second metal silicide seed layer on the entire surfaces of the first and second regions thereby to cover the first metal silicide capping layer and the second epitaxial layer.

In some embodiments, the first metal silicide layer has at least one metal element different from that in the second metal silicide layer.

In some embodiments, the first epitaxial layer is formed at both sides of the first metal gate electrode having an upper surface higher than an upper surface of the substrate and a lower surface lower than the upper surface of the substrate, and the second epitaxial layer is formed at both sides of the second metal gate electrode having an upper surface higher than an upper surface of the substrate and a lower surface lower than the upper surface of the substrate.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF EMBODIMENTS

Figure 1:
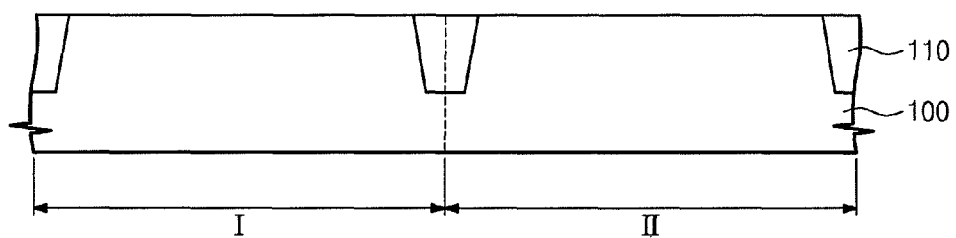
FIGS. 1 through 22 are cross-sectional views illustrating a method of manufacturing a semiconductor device according to an example embodiment of the present inventive concepts.

Various example embodiments will be described more fully hereinafter with reference to the accompanying drawings, in which some example embodiments are shown. The present inventive concepts may, however, be embodied in different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, example embodiments of the present inventive concepts will be described in detail with reference to the accompanying drawings.

FIG. 1 through FIG. 22 are cross-sectional views illustrating a method of manufacturing a semiconductor device according to an example embodiment of the present inventive concepts.

Referring to FIG. 1, a substrate 100 may be provided. The substrate 100 may comprise a rigid substrate, such as a bulk silicon substrate, a silicon-on-insulator (SOI) substrate, a gallium-arsenide substrate, a silicon-germanium substrate, a ceramic substrate, a quartz substrate, a glass substrate for display, or a flexible plastic substrate formed of, for example, polyethylene terephthalate, polymethylmethacrylate, polyimide, polycarbonate, polyethersulfone, or polyethylene naphthalate. The substrate 100 may include first and second regions I and II, respectively. The first and second regions I and II may have different electrical characteristic. For example, the first region I may be a PMOS transistor region and the second region II may be a NMOS transistor region. The substrate 100 may include device isolation regions 110 that may be formed by a shallow-trench-isolation (STI) process.

Figure 2:
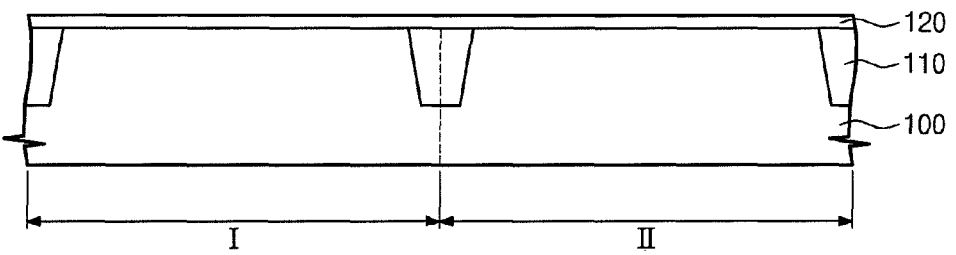

Referring to FIG. 2, a sacrificial insulating layer 120 may be formed on the substrate 100. The sacrificial insulating layer 120 may be formed on device isolation regions 110. The sacrificial insulating layer 120 may have a thickness of about 100 Å. The sacrificial insulating layer 120 may be formed of a silicon dioxide which is formed by a chemical-vapor-deposition (CVD) process and/or an atomic-layer-deposition (ALD) process.

Figure 3:
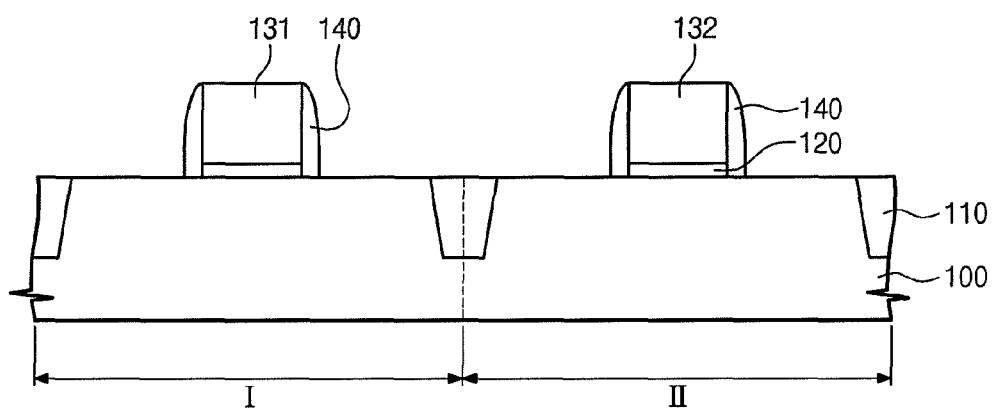

Referring to FIG. 3, first and second dummy gate patterns 131 and 132 having sidewalls may be formed on the sacrificial insulating layer 120 in the first and second regions I and II, respectively. The first and second dummy gate patterns 131 and 132 may be formed of a polysilicon (polycrystalline silicon) layer, a silicon nitride layer, and/or a silicon oxynitride layer. The sacrificial insulating layer 120 is etched such that the sacrificial insulating layer 120 remains under the first and second dummy gate patterns 131 and 132. Sidewall spacers 140 may be formed on the sidewalls of the first dummy gate pattern 131 and the sacrificial insulating layer 120 below the first dummy gate pattern 131. Sidewall spacers 140 may be formed on sidewalls of the second dummy gate pattern 132 and the sacrificial insulating layer 120 below the second dummy gate pattern 132. The sidewall spacers 140 may be formed of a silicon dioxide layer, a silicon nitride layer, and/or a silicon oxynitride layer.

Figure 4:
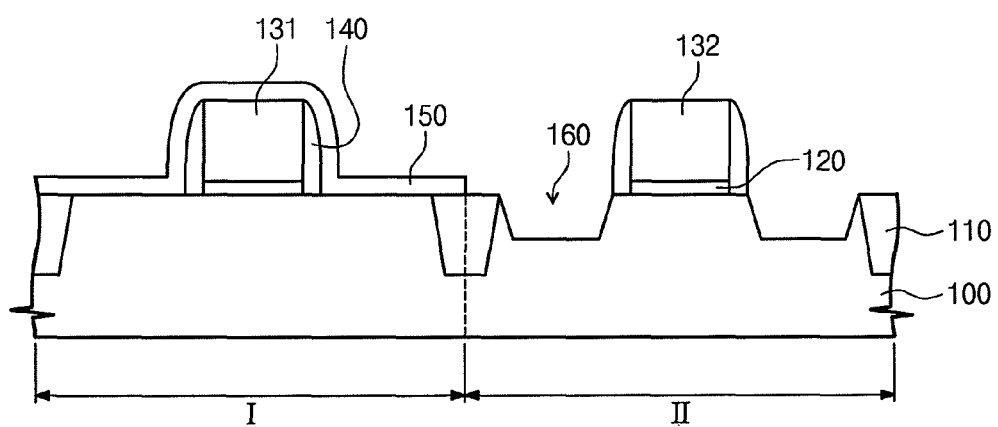

Referring to FIG. 4, a first etch stop layer 150 may be formed on the first dummy gate pattern 131. The first etch stop layer 150 may be formed of a silicon nitride layer and/or a silicon oxynitride layer by using by a chemical-vapor-deposition (CVD) process and/or an atomic-layer-deposition (ALD) process. After forming the first etch stop layer 150 on the entire surfaces of the first and second regions I and II, the first etch stop layer 150 may be processed such that the first etch stop layer 150 remains on the first region I and is removed from the second region II by using a photolithography and an etching process.

A first recess region 160 may be formed in the substrate 100 of the second region II by partially etching the substrate 100 adjacent to both sides of the second dummy gate pattern 132. That is, the first recess regions 160 are formed on both sides of the second dummy gate pattern 132. During this etching process, the first etch stop layer 150 may be used as a mask.

Figure 5:
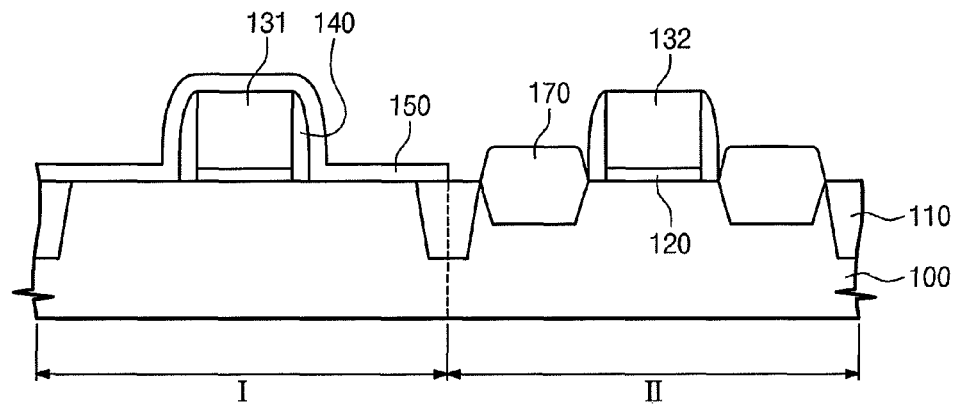

Referring to FIG. 5, a first epitaxial layer 170 may be formed in the first recess region 160. An upper surface of the first epitaxial layer 170 may have a higher level than the upper surface of the substrate 100 which is located beneath the second dummy gate pattern 132. If NMOS transistors are formed in the second region II, the first epitaxial layer 170 may include carbon (C) to increase mobility of electrons.

Figure 6:
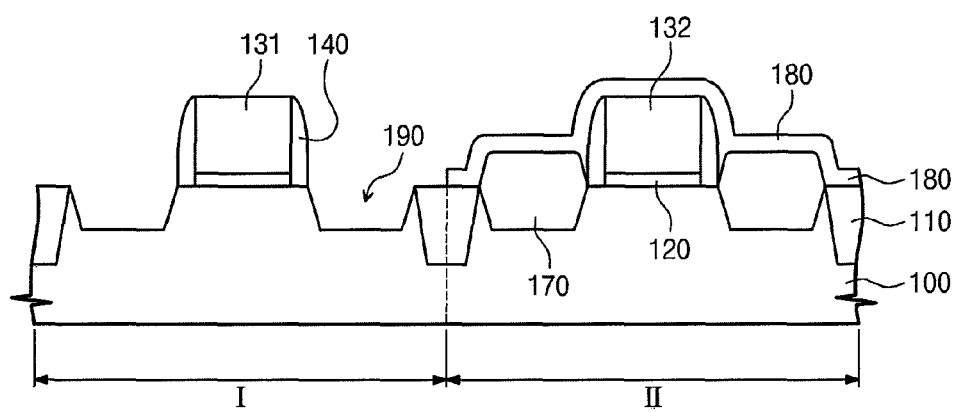

Referring to FIG. 6, the first etch stop layer 150 of the first region I may be removed and a second etch stop layer 180 may be formed on the second dummy gate pattern 132, on the first epitaxial layer 170 and on device isolation regions 110 of the second region II. The second etch stop layer 180 may be formed by a chemical-vapor-deposition (CVD) process and/or an atomic-layer-deposition (ALD) process. The second etch stop layer 180 may be formed of a silicon nitride layer and/or a silicon oxynitride layer. After forming the second etch stop layer 180 on the entire surfaces of the first and second regions I and II, the second etch stop layer 180 may be processed such that the second etch stop layer 180 remains on the second region II and is removed from the first region I by using a photolithograph and an etching process.

A second recess region 190 may be formed in the substrate 100 of the first region I by partially etching the substrate 100 adjacent to both sides of the first dummy gate pattern 131. That is, the second recess regions 190 are formed on both sides of the first dummy gate pattern 131. During this process step, the second etch stop layer 180 may be used as a mask.

Figure 7A:
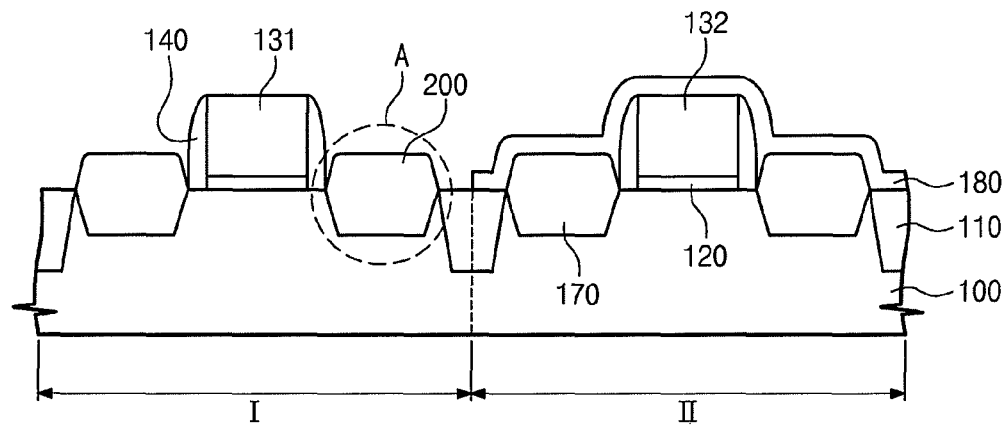
Figure 7B:
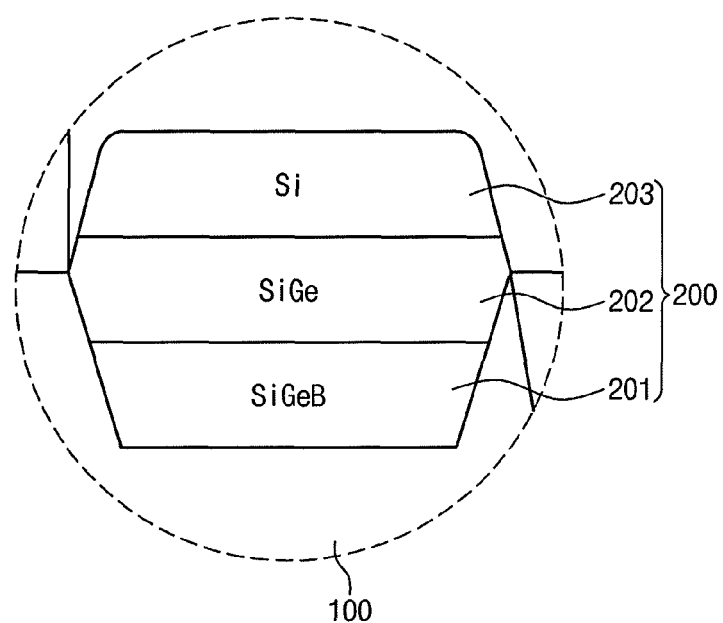

FIG. 7A is a cross-sectional view illustrating the method of manufacturing a semiconductor device and FIG. 7B is an exploded cross-sectional view of a second epitaxial layer 200 of FIG. 7A. Referring to FIGS. 7A and 7B, a second epitaxial layer 200 may be formed in the second recess region 190. An upper surface of the second epitaxial layer 200 may have a higher level than the upper surface of the substrate 100 which is located beneath the first dummy gate pattern 131. If PMOS transistors are formed in the first region I, the second epitaxial layer 200 may include Germanium (Ge) to increase mobility of holes. In order to further increase the performance of the PMOS transistors, as illustrated in FIG. 7B, the second epitaxial layer 200 may have three portions including a lower portion 201, a middle portion 202, and an upper portion 203. The lower portion 201 may include, for example, silicon (Si), boron (B), and germanium (Ge). The middle portion 202 may include, for example, silicon (Si) and germanium (Ge). The upper portion 203 may include, for example, silicon (Si).

Figure 8:
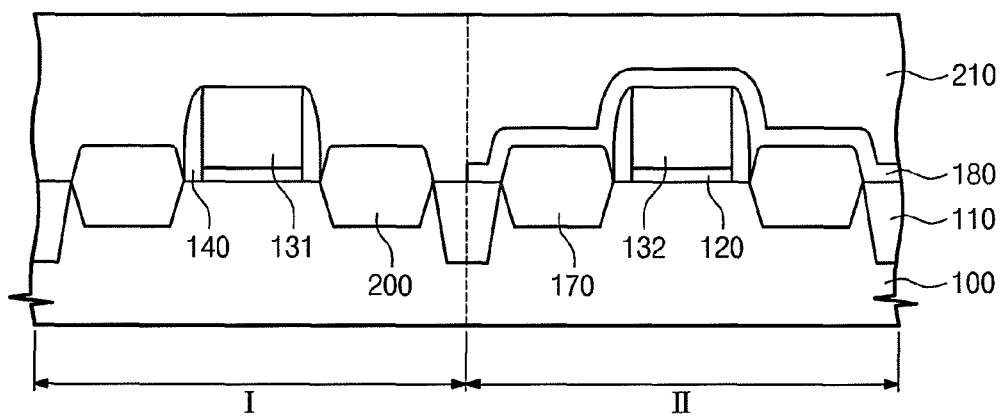

Referring to FIG. 8, a first interlayer dielectric layer 210 may be formed on the first and second regions I and II. More specifically, the first interlayer dielectric layer 210 may be formed on the first dummy gate pattern 131 in the first region I and on the second etch stop layer 180 in the second region II. The first interlayer dielectric layer 210 may be formed by a high-density-plasma (HDP) process or a flowable-chemical-vapor-deposition (FCVD) process.

Figure 9:
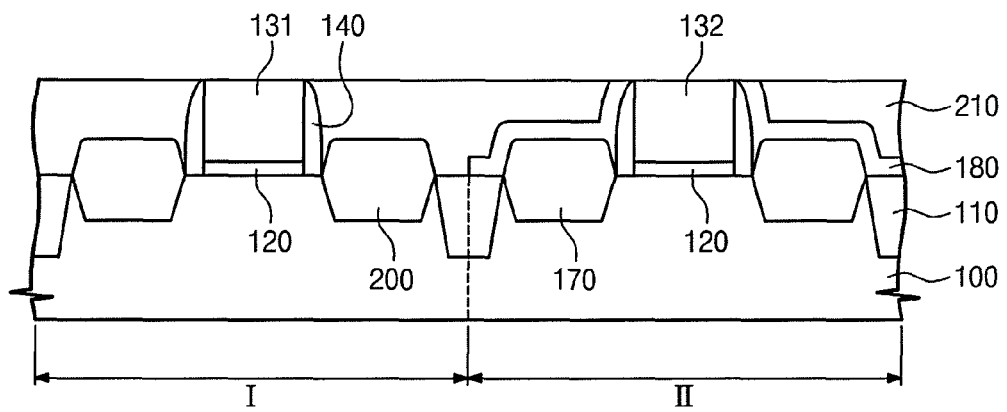

Referring to FIG. 9, the first interlayer dielectric layer 210 may be planarized by an etch-back process or a chemical-mechanical-polishing (CMP) process to expose the upper surfaces of the first and second dummy gate patterns 131 and 132.

Figure 10:
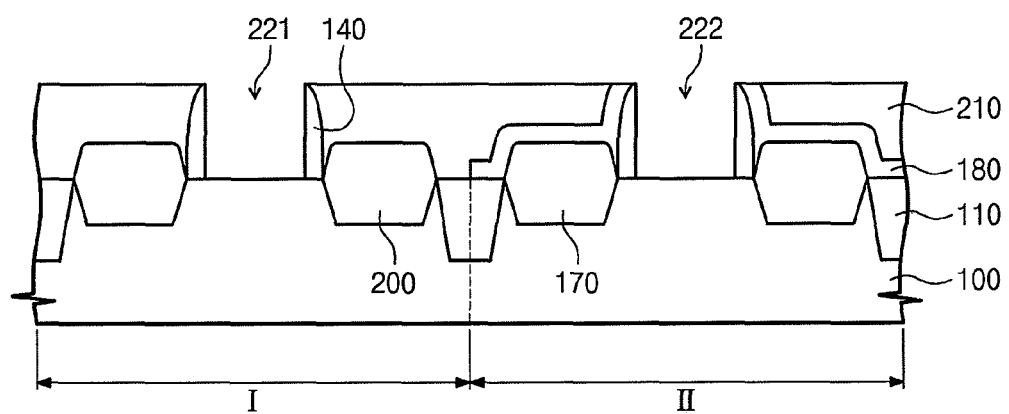

Referring to FIG. 10, first and second trenches 221 and 222 having sidewalls and bottoms may be formed in the first and second regions I and II. The first and second trenches 221 and 222 may be formed by removing the first and second dummy gate patterns 131 and 132 and the sacrificial layer 120 under each of the first and second dummy gate patterns 131 and 132, respectively.

Figure 11:
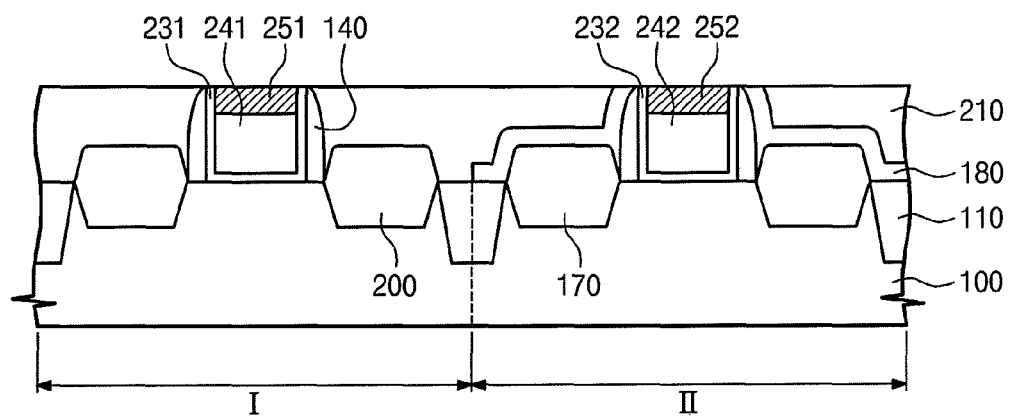

Referring to FIG. 11, first and second gate dielectric layers 231 and 232 may be formed on the sidewalls and at the bottoms of the first and second 221 and 222, respectively. The first and second gate dielectric layers 231 and 232 may comprise a high-k dielectric layer, for example, a hafnium-oxide layer, a hafnium-silicon-oxide layer, a lanthanum-oxide layer, a zirconium-oxide layer, a tantalum-oxide layer, a barium-strontium-titanium-oxide layer, barium-titanium-oxide layer, a strontium-titanium-oxide layer, a lithium-oxide layer, a aluminum-oxide layer, a lead-scandium-tantalum oxide layer, and/or a lead-zinc-niobate layer. The first and second gate dielectric layers 231 and 232 may have a multi-layer dielectric layer structure including a silicon dioxide layer and a high-k dielectric layer.

A first metal gate electrode layer 241 may be formed on the first gate dielectric layer 231 in the first trench 221. The first metal gate electrode layer 241 may comprise, for example, titanium (Ti), titanium nitride (TiN), tantalum (Ta), tantalum nitride (TaN), tungsten (W), copper (Cu), and/or aluminum (Al).

A second metal gate electrode layer 242 may be formed on the second gate dielectric layer 232 in the second trench 222. The second metal gate electrode layer 242 may comprise, for example, titanium (Ti), titanium nitride (TiN), tantalum (Ta), tantalum nitride (TaN), tantalum aluminum carbide (TaAlC), tungsten (W), copper (Cu), and/or aluminum (Al).

Upper portions of the first and second metal gate electrode layers 241 and 242 may be recessed by an etch-back process to expose the upper sidewalls of the first and second trenches 221 and 222 having the first and second gate dielectric layers 231 and 232, respectively, thereon.

First and second gate capping layers 251 and 252 may be formed on the first and second metal gate electrode layers 241 and 242 in the first and second trenches 221 and 222, respectively. The first and second gate capping layers 251 and 252 may comprise, for example, silicon carbide (SiC), silicon carbon nitride (SiCN), silicon carbon oxynitride (SiCON), silicon nitride (SiN), and/or silicon oxynitride (SiON). After forming the first and second gate capping layers 251 and 252 on the first interlayer dielectric layer 210 and in the first and second trenches 221 and 222, the first and second gate capping layers 251 and 252 may be planarized by a chemical-mechanical-polishing process or an etch-back process to expose the upper surface of the first interlayer dielectric layer 210 and the first and second gate dielectric layers 231 and 232.

Figure 12:
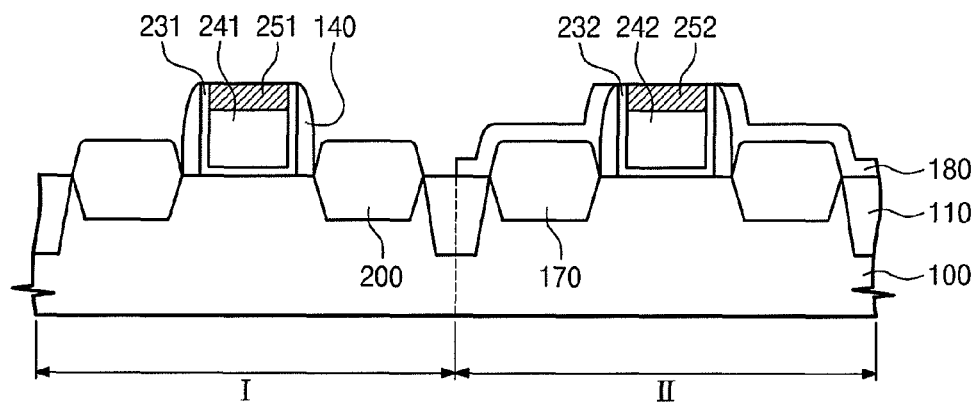

Referring to FIG. 12, the first interlayer dielectric layer 210 may be removed to expose the second epitaxial layer 200 in the first region I. During this process step, the second etch stop layer 180 may remain on the first epitaxial layer 170 in the second region II.

Figure 13:
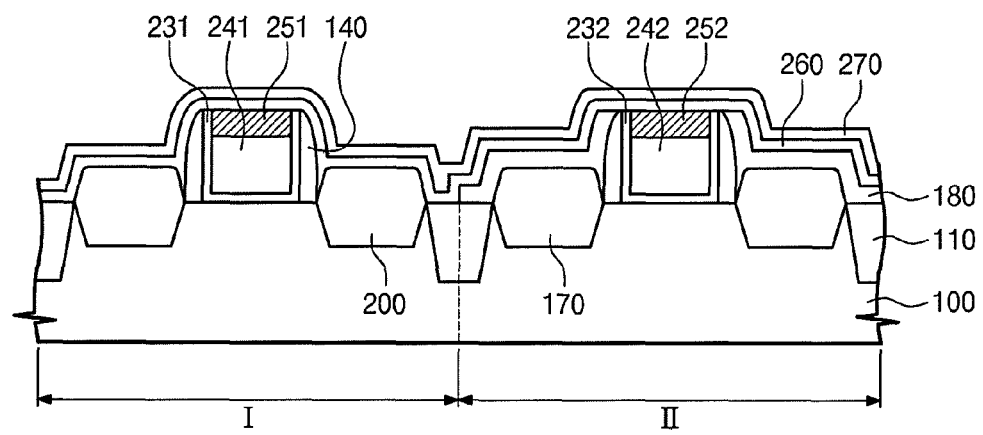

Referring to FIG. 13, a first metal silicide seed layer 260 and a first metal silicide capping layer 270 may be formed on the entire surfaces of the first and second regions I and II. More specifically, the first metal silicide seed layer 260 may be formed on the second epitaxial layer 200 in the first region I and on the second etch stop layer 180 in the second region II. The first metal silicide seed layer 260 may be formed of, for example, nickel (Ni), platinum (Pt), and/or cobalt (Co). The first metal silicide capping layer 270 may be formed on the first metal silicide seed layer 260 and may comprise, for example, titanium nitride (TiN).

Figure 14:
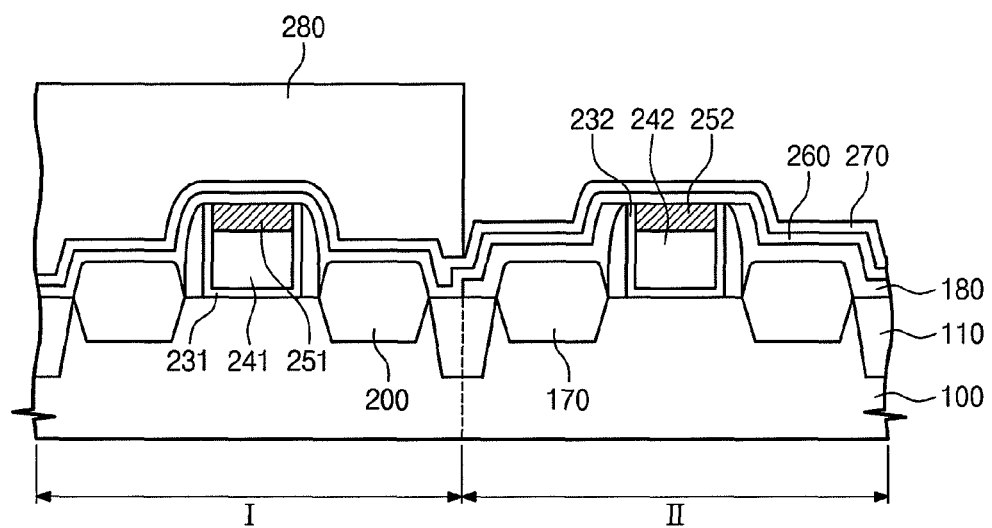

Referring to FIG. 14, a mask pattern 280 may be formed on the first metal silicide capping layer 270 to cover the first region I. The mask pattern 280 may comprise a photo-resist.

Figure 15:
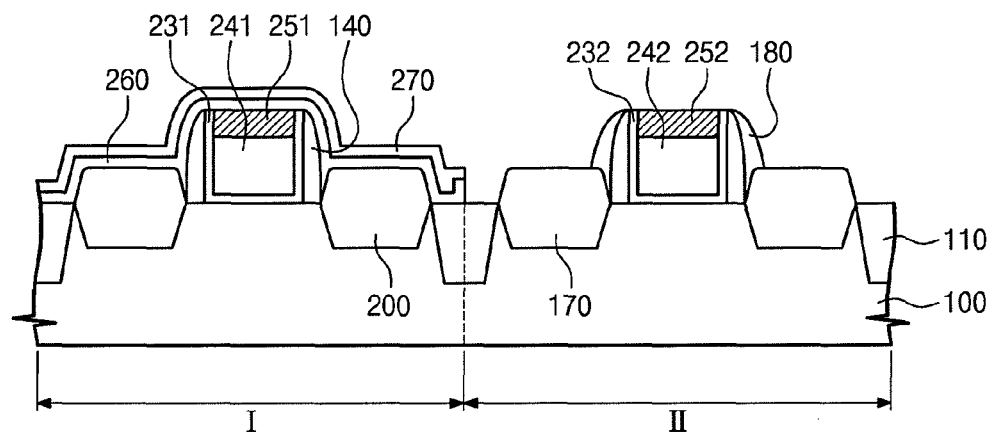

Referring to FIG. 15, the first metal silicide capping layer 270, the first metal silicide seed layer 260, and the second etch stop layer 180 which are formed in the second region II may be removed to expose the first epitaxial layer 170. The first metal silicide capping layer 270 may be removed by a dry or a wet etch process using the mask pattern 280 as a mask. The first metal silicide capping layer 270 may be removed by a wet etch process using, for example, a chemical solution containing sulfuric acid, hydrogen peroxide, deionized water, and ammonia. The first metal silicide seed layer 260 may be removed by a wet etch process using, for example, a chemical solution containing nitric acid, hydrochloric acid, and deionized water. The mask pattern 280 and the second etch stop layer 180 may be removed after removing the first metal silicide capping layer 270 and the first metal silicide seed layer 260. The second etch stop layer 180 may be removed by a dry or wet etching process. If the second etch stop layer 180 is removed by a dry etching process, it may partially remain on a sidewall of the sidewall spacer 140 and on a portion of first epitaxial layer 170, as illustrated in FIG. 15.

Figure 16:
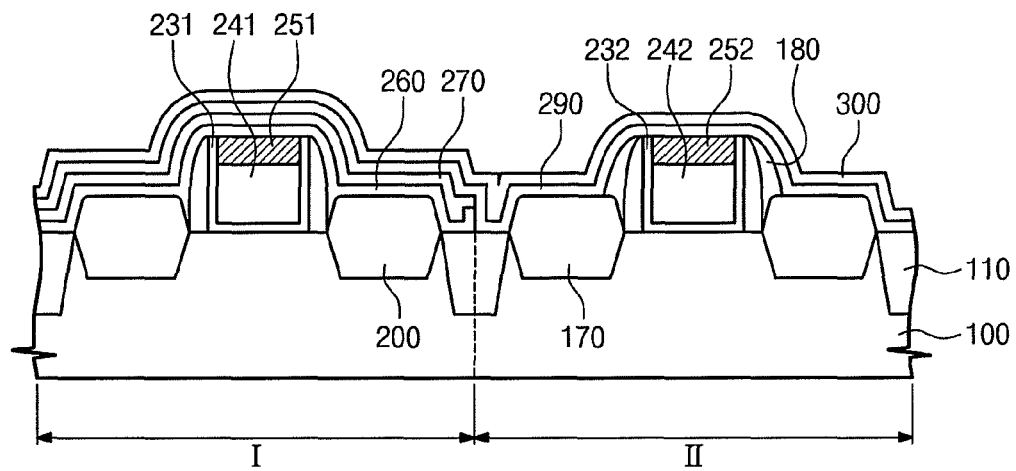

Referring to FIG. 16, a second metal silicide seed layer 290 may be formed on the entire surface of the first and second regions I and II. The second metal silicide seed layer 290 may have at least one metal element not existing in the first metal silicide layer 260. More specifically, the second metal silicide seed layer 290 may comprise, for example, titanium (Ti), and may be formed on the first metal silicide capping layer 270 in the first region I and on the first epitaxial layer 170 in the second region II. A second metal silicide capping layer 300 may be formed on the second metal silicide seed layer 290. The second metal silicide capping layer 300 may comprise, for example, titanium nitride (TiN). The step of forming the second metal silicide capping layer 300 may be omitted to reduce the cost of manufacturing the semiconductor device.

Figure 17:
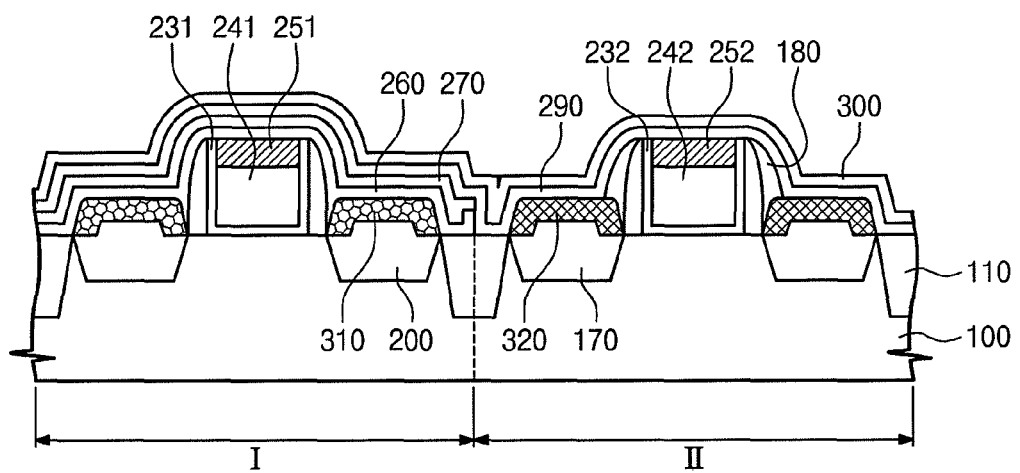

Referring to FIG. 17, first and second metal silicide layers 310 and 320 may be formed through a heat-treatment process. The first metal silicide layer 310 may be formed on the second epitaxial layer 200 in the first region I. The first metal silicide layer 310 may comprise, for example, a nickel platinum silicon compound (NiPtSi) and/or a nickel cobalt silicon compound (NiCoSi). The second metal silicide layer 320 may be formed on the first epitaxial layer 170 in the second region II. The second metal silicide layer 320 may comprise, for example, a titanium silicon compound (TiSi).

The nickel platinum silicon compound (NiPtSi) and the nickel cobalt silicon compound (NiCoSi) of the first metal silicide layer 310 in the first region I may lower the Schottky Barrier Height (SBH) with a contact plug which may be formed on the source and/or drain regions of PMOS transistors in the first region I. The titanium silicon compound (TiSi) of the second metal silicide layer 320 of the second region II may lower the Schottky Barrier Height (SBH) with a contact plug which may be formed on the source and/or drain regions of NMOS transistors in the second region II. If the Schottky Barrier Height (SBH) is lowered, the electrical resistance between the contact plugs, which are formed on the source and/or drain regions, and the source and/or drain regions may be reduced. Thereby the performance and reliability of the semiconductor device may be increased.

Figure 18:
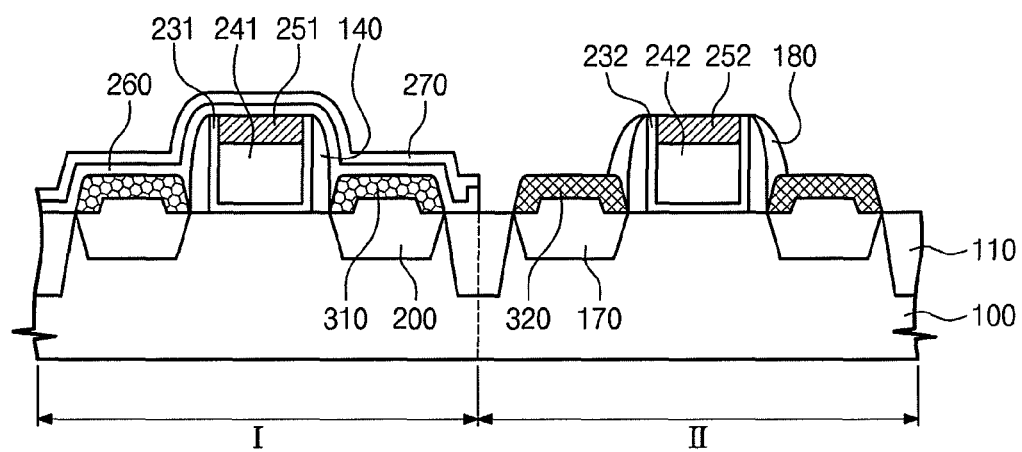

Referring to FIG. 18, the second metal silicide capping layer 300 and the second silicide seed layer 290 may be removed using, for example, a chemical solution containing sulfuric acid, hydrogen peroxide, deionized water, and ammonia.

Figure 19:
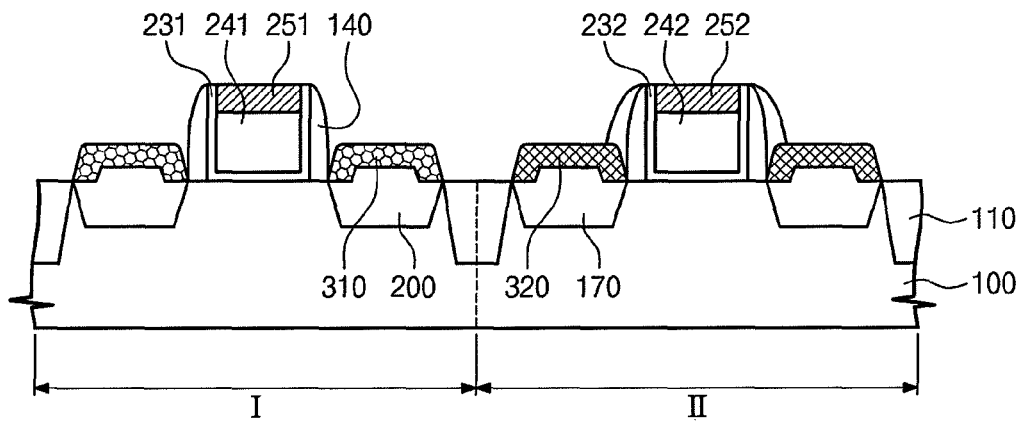

Referring to FIG. 19, the first metal silicide capping layer 270 may be removed using, for example, a chemical solution containing acid, hydrogen peroxide, deionized water, and ammonia and the first metal silicide seed layer 260 may be removed using, for example, a chemical solution containing nitric acid, hydrochloric acid, and deionized water.

Figure 20:
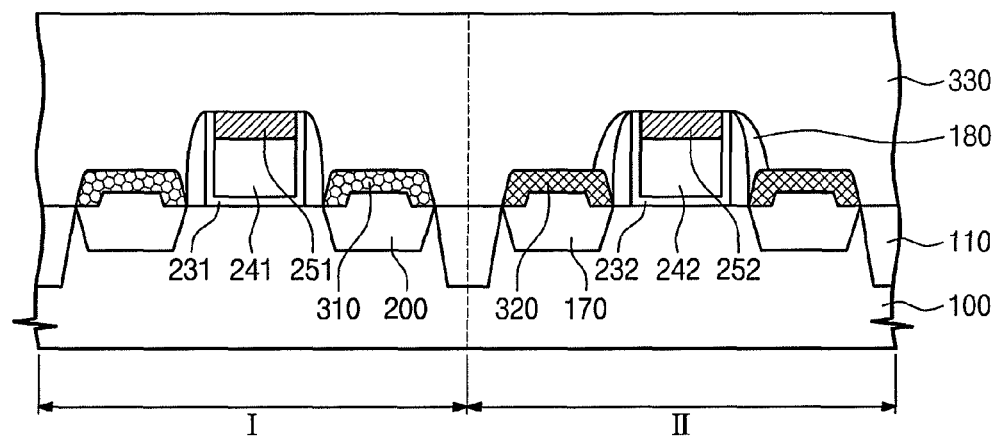

Referring to FIG. 20, a second interlayer dielectric layer 330 may be formed on the entire surfaces of the first and second regions I and II. The second interlayer dielectric layer 330 may be formed by a high-density-plasma (HDP) process or a flowable-chemical-vapor-deposition (FCVD) process. The second interlayer dielectric layer 330 may be planarized by a CMP or an etch-back process.

Figure 21:
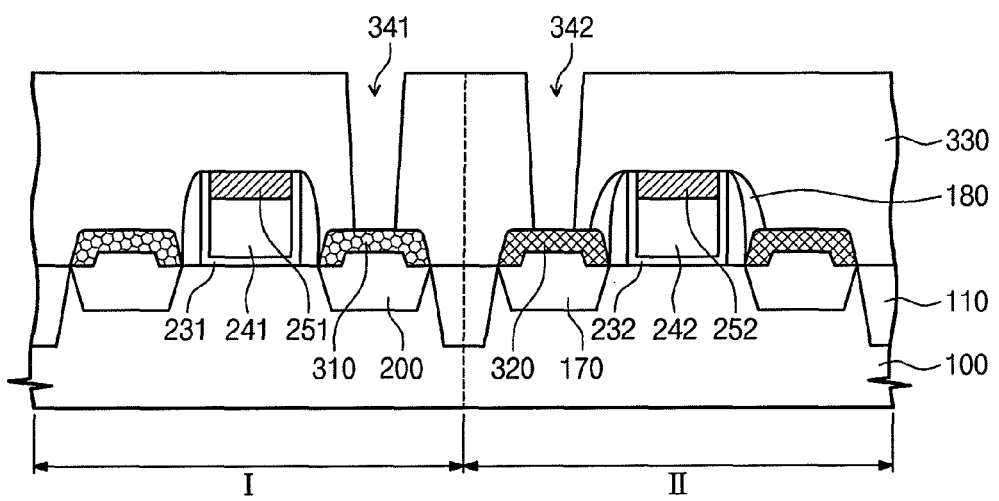

Referring to FIG. 21, first and second contact holes 341 and 342, which are passing through the second interlayer dielectric layer 330 and exposing the upper surfaces of the first and second metal silicide layers 310 and 320, respectively, may be formed in the second interlayer dielectric layer 330.

Figure 22:
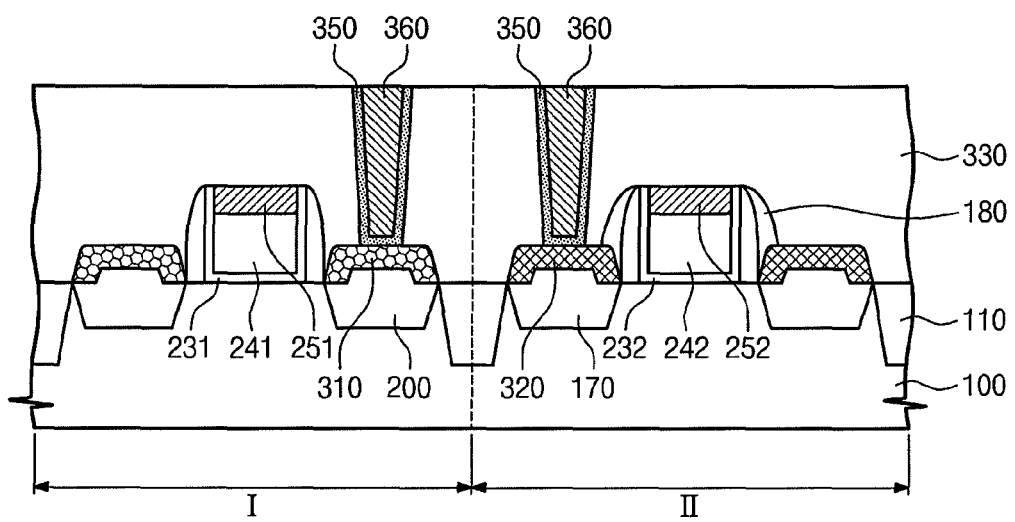

Referring to FIG. 22, a barrier metal layer 350 may be formed on the inner sidewalls and at the bottoms of the first and second contact holes 341 and 342, respectively. The barrier metal layer 350 may have a stacked multilayer structure comprising a titanium (Ti) layer and a titanium nitride (TiN) layer. A contact plug 360 may be formed on the barrier metal layer 350 in the first and second contact holes 341 and 342. The contact plug 360 may comprise, for example, tungsten (W) that is planarized by a CMP process to expose the upper surfaces of the second interlayer dielectric layer 330.

FIGS. 1 through 19 and FIGS. 23 through 25 are cross-sectional views illustrating a method of manufacturing a semiconductor device according to another example embodiment of the present inventive concepts. The example embodiment of FIGS. 1-19 and 23-25, will only explain features which are different from the previous embodiment. That is, FIGS. 1 through 19 will not be explained as the explanation is the same as the previous embodiment of the present inventive concepts.

Figure 23:
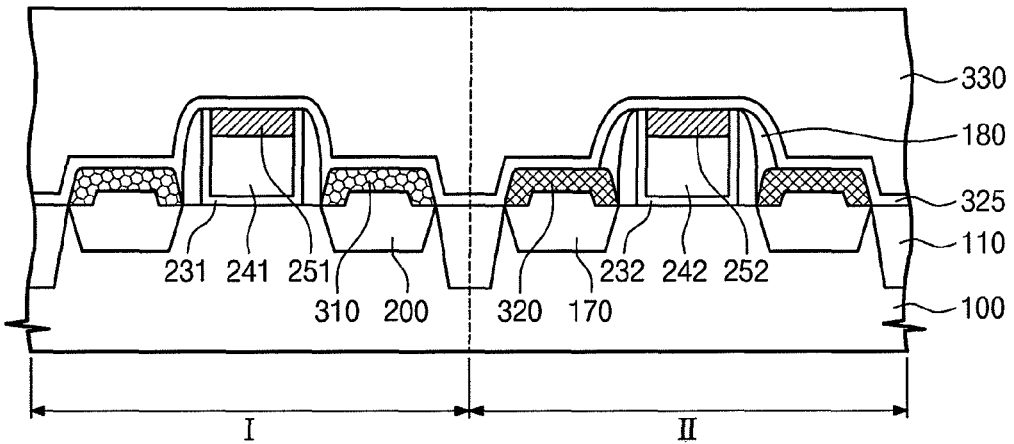
FIGS. 23 through 25 are cross-sectional views illustrating a method of manufacturing a semiconductor device according to an example embodiment of the present inventive concepts.

Referring to FIG. 23, a third etch stop layer 325 may be formed on the entire surface of the first and second regions I and II. Specifically, the third etch stop layer 35 is formed on the first and second metal silicide layers 310 and 320 in the first and second regions I and II, respectively, before forming the second interlayer dielectric layer 330. The third etch stop layer 325 may be formed by a chemical-vapor-deposition (CVD) process and/or an atomic-layer-deposition (ALD) process. The third etch stop layer 325 may be formed of, for example, a silicon nitride layer and/or a silicon oxynitride layer. The upper portion of the second interlayer dielectric layer 330 may be planarized by a CMP process.

Figure 24:
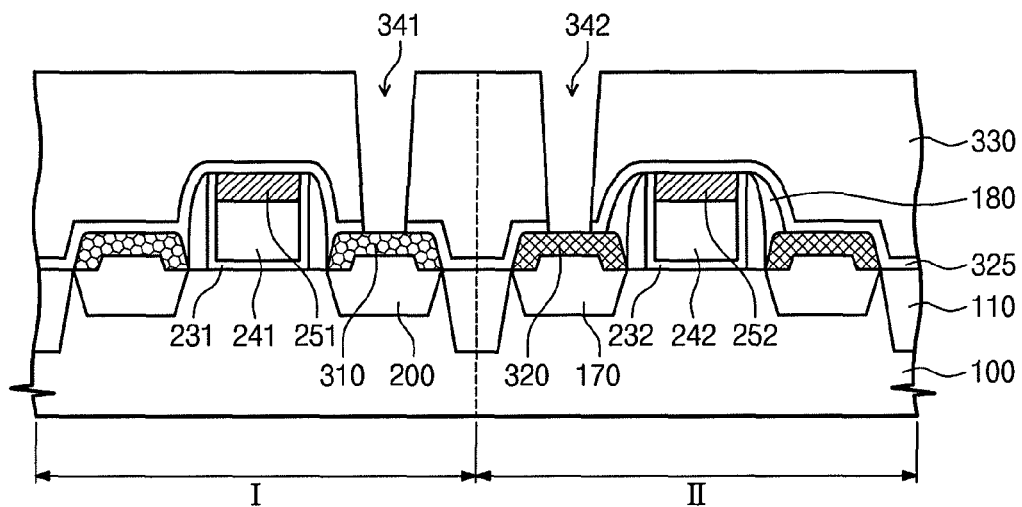

Referring to FIG. 24, first and second contact holes 341 and 342, which are passing through the second interlayer dielectric layer 330 and the third etch stop layer 325 and exposing the upper surfaces of the first and second metal silicide layers 310 and 320, may be formed in the second interlayer dielectric layer 330.

Figure 25:
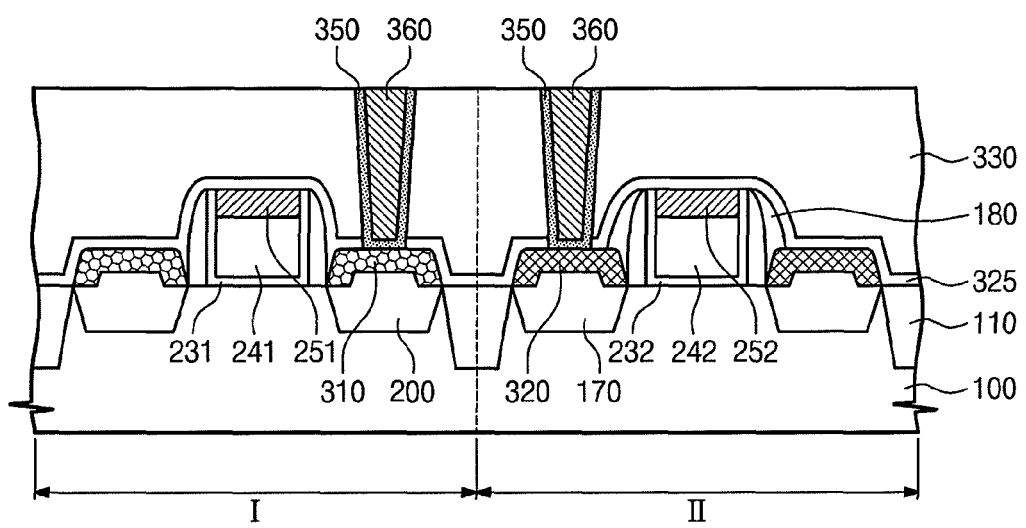

Referring to FIG. 25, a barrier metal layer 350 may be formed on the inner sidewalls and at the bottoms of the first and second contact holes 341 and 342. The barrier metal layer 350 may have a stacked multilayer structure comprising, for example, a titanium (Ti) layer and a titanium nitride (TiN) layer. A contact plug 360 may be formed on the barrier metal layer 350 in the first or second contact holes 341 and 342. The contact plug 360 may comprise, for example, tungsten (W) that is planarized by a CMP process to expose the upper surfaces of the second interlayer dielectric layer 330.

FIGS. 1 through 13 and FIGS. 26 through 33 are cross-sectional views illustrating a method of manufacturing a semiconductor device according to another example embodiment of the present inventive concepts. The example embodiment of FIGS. 1-19 and 26-33, will only explain features which are different from the previous embodiment. That is, FIGS. 1 through 13 will not be explained as the explanation is the same as the previous embodiment of the present inventive concepts.

Figure 26:
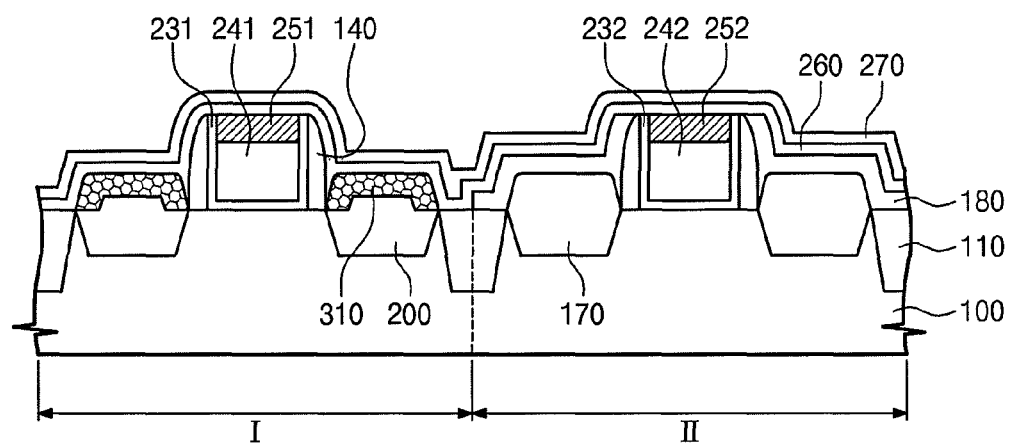
FIGS. 26 through 33 are cross-sectional views illustrating a method of manufacturing a semiconductor device according to an example embodiment of the present inventive concepts.

Referring to FIG. 26, a first metal silicide layer 310 may be formed on the second epitaxial layer 200 in the first region I by performing a first heat-treatment process after forming the first metal silicide seed layer 260 and the first metal silicide capping layer 270. The first metal silicide layer 310 may comprise, for example, a nickel platinum silicon compound (NiPtSi) and/or a nickel cobalt silicon compound (NiCoSi). The second etch stop layer 180 that is formed on the first epitaxial layer 170 may protect the first epitaxial layer 170 from having any metal silicide layer formed thereon. During this process step, the second etch stop layer 180 may be a protection layer which protects against the silicidation of the first epitaxial layer 170.

Figure 27:
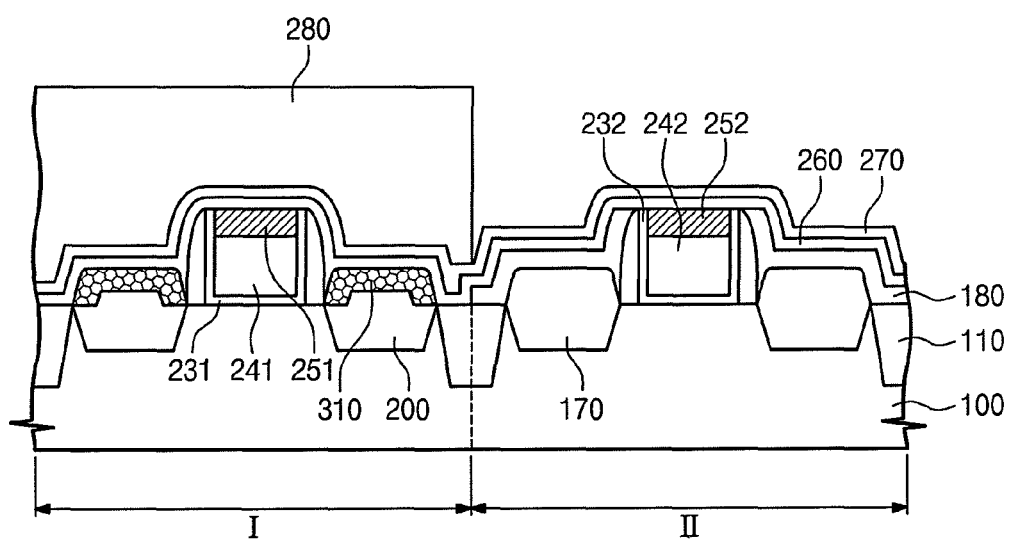

Referring to FIG. 27, a mask pattern 280 may be formed on the first metal silicide capping layer 270 to cover the first region I. The mask pattern 280 may comprise a photo-resist.

Figure 28:
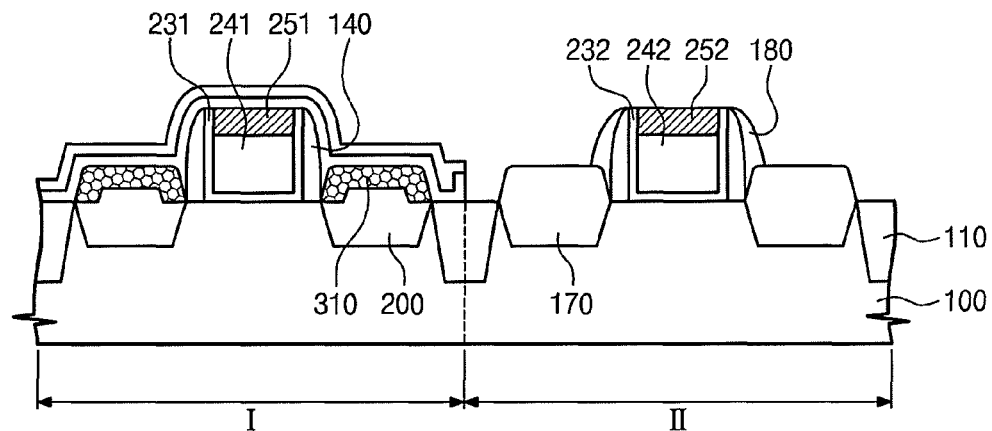

Referring to FIG. 28, the first metal silicide capping layer 270, the first metal silicide seed layer 260, and the second etch stop layer 180 which are formed in the second region II may be removed to expose the first epitaxial layer 170. The first metal silicide capping layer 270 may be removed by a dry or a wet etch process using the mask pattern 280 as a mask. The first metal silicide capping layer 270 may be removed by a wet etch process using, for example, a chemical solution containing sulfuric acid, hydrogen peroxide, deionized water, and ammonia. The first metal silicide seed layer 260 may be removed by a wet etch process using, for example, a chemical solution containing nitric acid, hydrochloric acid, and deionized water. The mask pattern 280 and the second etc stopping layer 180 may be removed after removing the first metal silicide capping layer 270 and the first metal silicide seed layer 260. The second etch stop layer 180 may be removed by a dry or wet etching process. If the second etch stop layer 180 is removed by a dry etching process, the second etch stop layer 180 may partially remain on a sidewall of the sidewall spacer 140.

Figure 29:
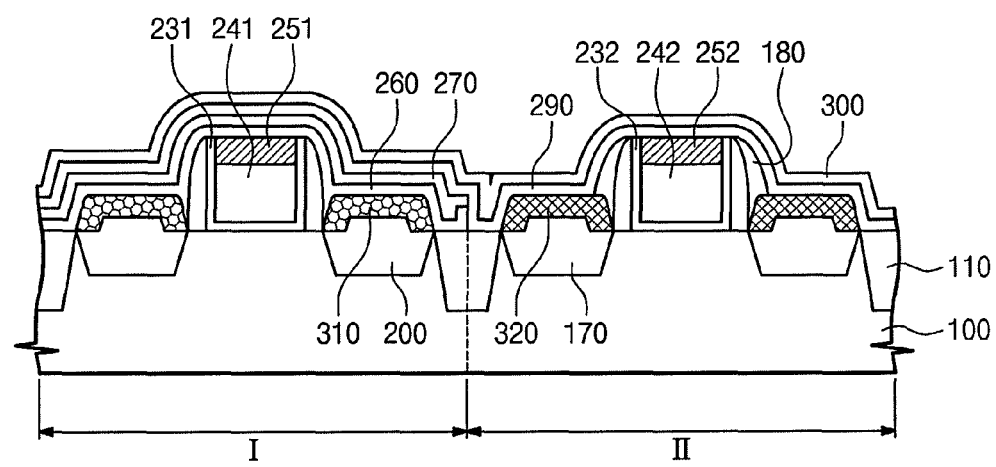

Referring to FIG. 29, a second metal silicide seed layer 290 may be formed on the entire surface of the first and second regions I and II. The second metal silicide seed layer 290 may have at least one metal element not existing in the first metal silicide layer 260. More specifically, the second metal silicide seed layer 290 may comprise, for example, titanium (Ti), and be formed on the first metal silicide capping layer 270 in the first region I and on the first epitaxial layer 170 in the second region II. A second metal silicide capping layer 300 may be formed on the second metal silicide seed layer 290. The second metal silicide capping layer 300 may comprise, for example, titanium nitride (TiN). The process step of forming the second metal silicide capping layer 300 may be omitted to reduce the cost of manufacturing the semiconductor device. A second metal silicide layer 320 may be formed on the first epitaxial layer 170 in the second region II by performing a second heat-treatment process. The second metal silicide layer 320 may comprise, for example, a titanium silicon compound (TiSi).

Figure 30:
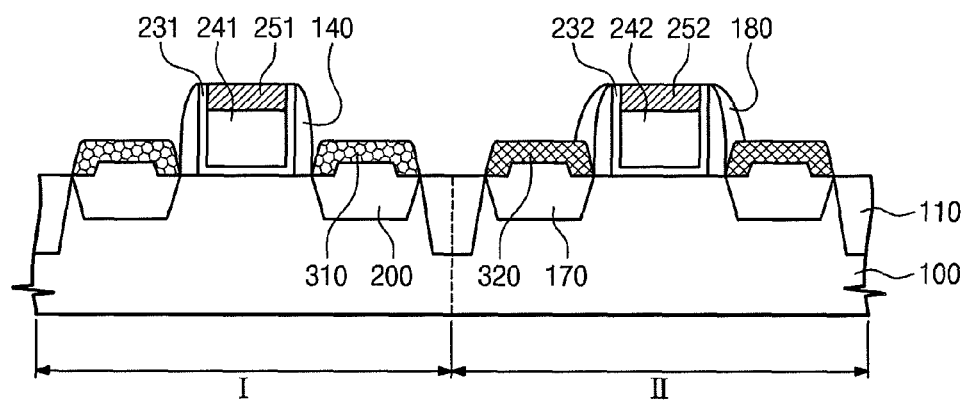

Referring to FIG. 30, the second metal silicide capping layer 300, the second silicide seed layer 290, and the first metal silicide capping layer 270 may be removed by using, for example, a chemical solution containing sulfuric acid, hydrogen peroxide, deionized water, and ammonia. The first metal silicide seed layer 260 may be removed by using, for example, a chemical solution containing nitric acid, hydrochloric acid, and deionized water.

Figure 31:
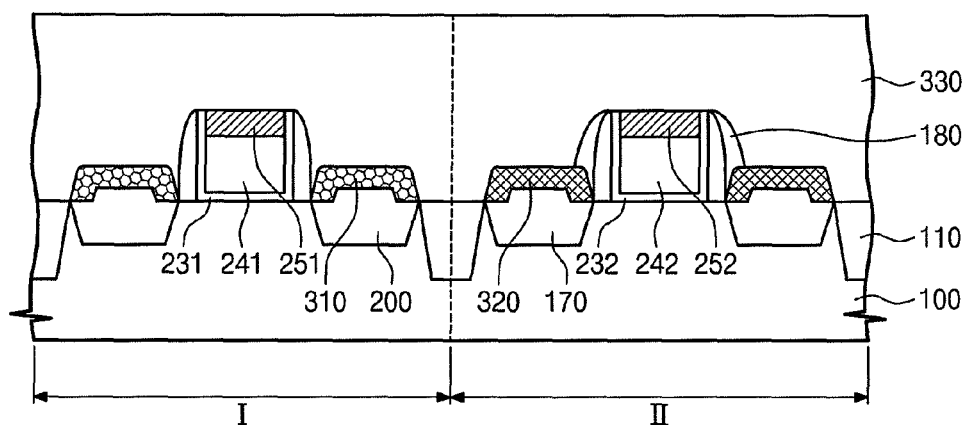

Referring to FIG. 31, a second interlayer dielectric layer 330 may be formed on the entire surfaces of the first and second regions I and II. The second interlayer dielectric layer 330 may be formed by a high-density-plasma (HDP) process or a flowable-chemical-vapor-deposition (FCVD) process. The second interlayer dielectric layer 330 may be planarized by a CMP or an etch-back process.

Figure 32:
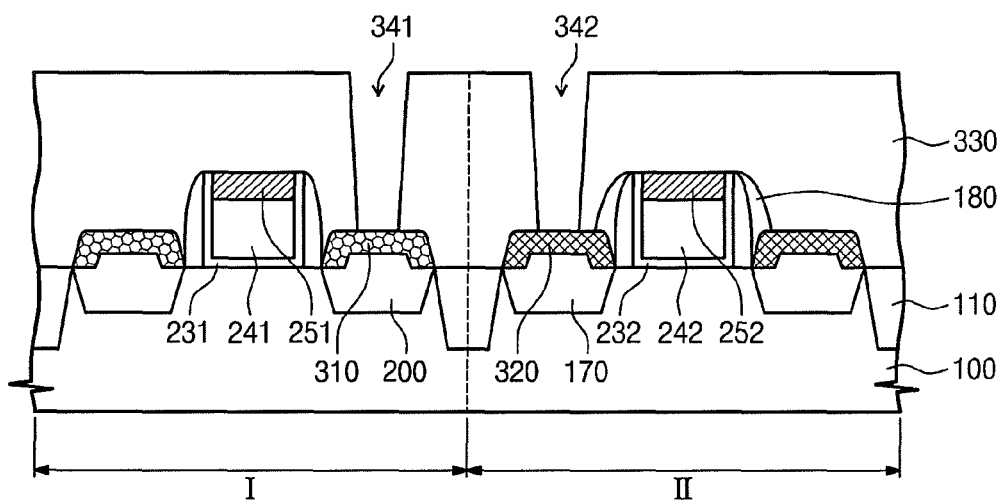

Referring to FIG. 32, first and second contact holes 341 and 342, which are passing through the second interlayer dielectric layer 330 and exposing the upper surfaces of the first and second metal silicide layers 310 and 320, respectively, may be formed in the second interlayer dielectric layer 330.

Figure 33:
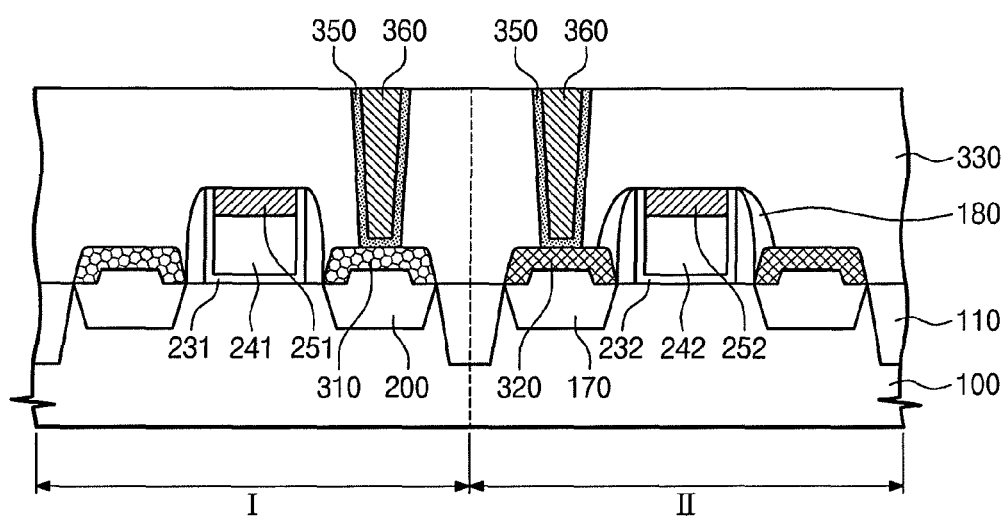

Referring to FIG. 33, a barrier metal layer 350 may be formed on the inner sidewalls and at the bottoms of the first and second contact holes 341 and 342. The barrier metal layer 350 may have a stacked multilayer structure comprising, for example, a titanium (Ti) layer and a titanium nitride (TiN) layer. A contact plug 360 may be on the barrier metal layer 350 in the first or second contact holes 341 and 342. The contact plug 360 may comprise, for example, tungsten (W) that is planarized by a CMP process to expose the upper surface of the second interlayer dielectric layer 330.

FIGS. 1 through 13 and FIGS. 34 through 39 are cross-sectional views illustrating a method of manufacturing a semiconductor device according to another example embodiment of the present inventive concepts. The example embodiment of FIGS. 1-19 and 34-39, will only explain features which are different from the previous embodiment. That is, FIGS. 1 through 13 will not be explained as the explanation is the same as the previous embodiment of the present inventive concepts.

Figure 34:
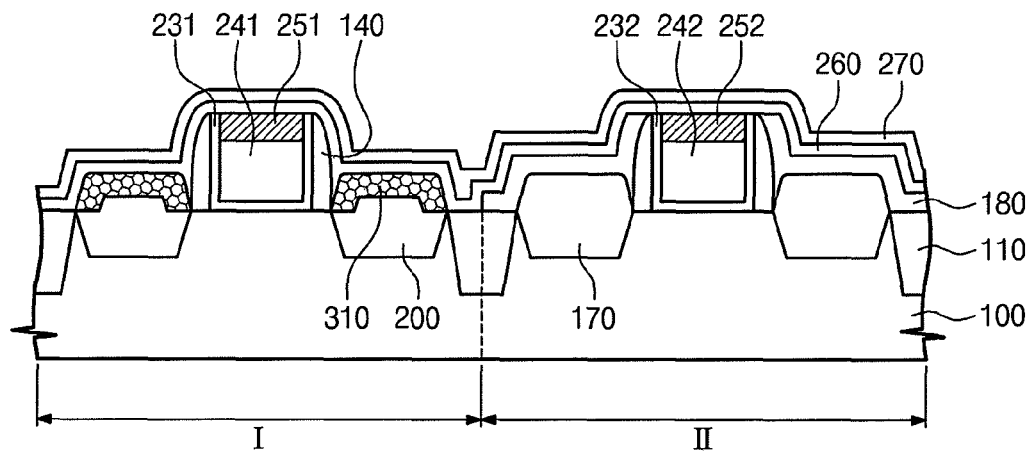
FIGS. 34 through 39 are cross-sectional views illustrating a method of manufacturing a semiconductor device according to an example embodiment of the present inventive concepts.

Referring to FIG. 34, a first metal silicide layer 310 may be formed on the second epitaxial layer 200 in the first region I by performing a first heat-treatment process after forming the first metal silicide seed layer 260 and the first metal silicide capping layer 270. The first metal silicide layer 310 may comprise a nickel platinum silicon compound (NiPtSi) and/or a nickel cobalt silicon compound (NiCoSi). The second etch stop layer 180 that is formed on the first epitaxial layer 170 may protect from forming any metal silicide layer. At this moment, the second etch stop layer 180 may be performed as a protection layer from the silicidation of the first epitaxial layer 170.

Figure 35:
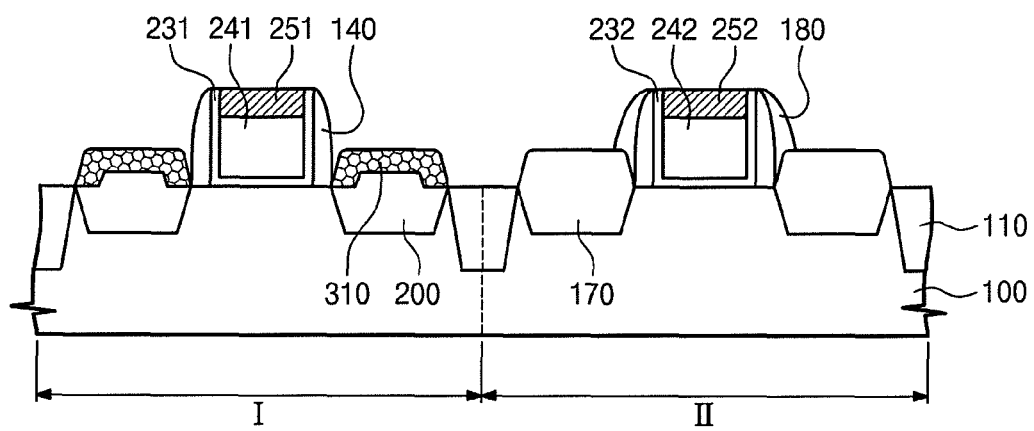

Referring to FIG. 35, the first metal silicide capping layer 270 may be removed by using, for example, a chemical solution containing acid, hydrogen peroxide, deionized water, and ammonia. The first metal silicide seed layer 260 may be removed using, for example, a chemical solution containing nitric acid, hydrochloric acid, and deionized water. The second etch stop layer 180 may be removed using a dry or a wet etch process. If the second etch stop layer 180 is removed by a dry etching process, the second etch stop layer 180 may partially remain on a sidewall of the sidewall spacer 140 and a portion of the first epitaxial layer 170.

Figure 36:
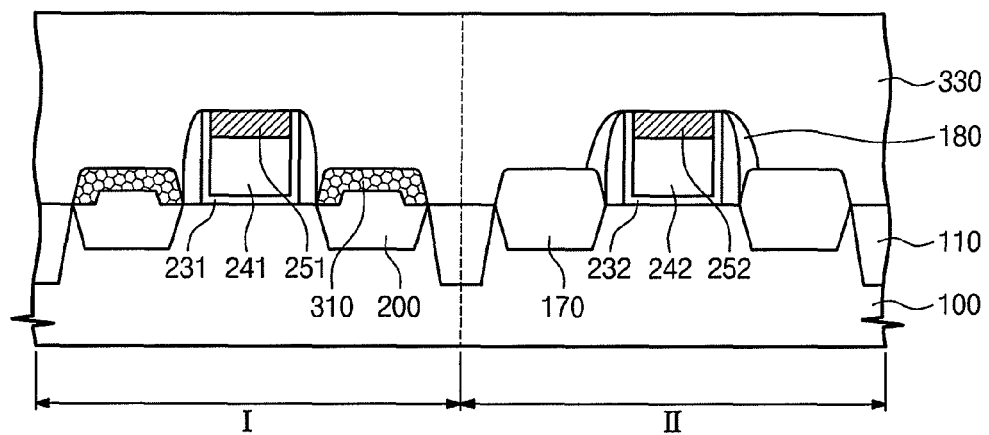

Referring to FIG. 36, a second interlayer dielectric layer 330 may be formed on the entire surfaces of the first and second regions I and II. The second interlayer dielectric layer 330 may be formed by a high-density-plasma (HDP) process or a flowable-chemical-vapor-deposition (FCVD) process. The second interlayer dielectric layer 330 may be planarized by a CMP or an etch-back process.

Figure 37:
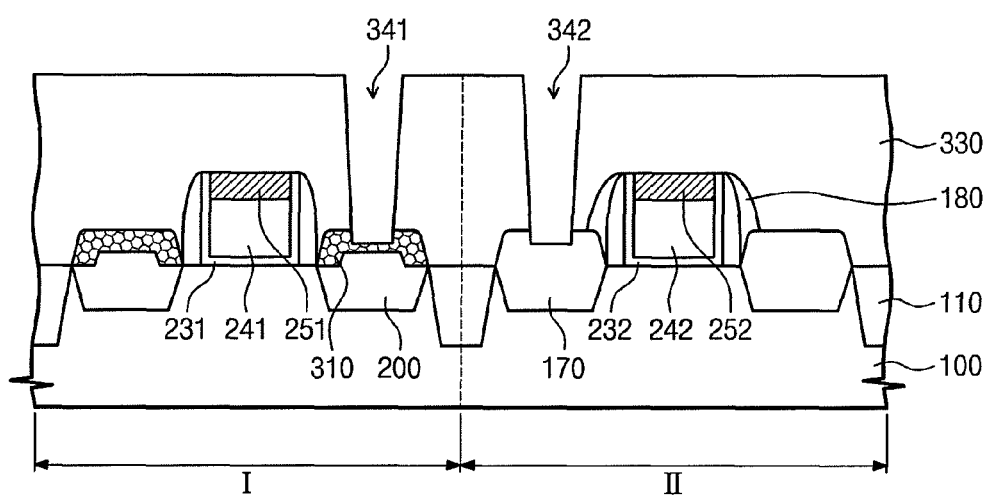

Referring to FIG. 37, a first contact hole 341, which is passing through the second interlayer dielectric layer 330 and exposing the upper surface of the first metal silicide layers 310, may be formed in the second interlayer dielectric layer 330. A second contact hole 342, which is passing through the second interlayer dielectric layer 330 and exposing the upper surface of the first epitaxial layer 170, may be formed in the interlayer dielectric layer 330.

Figure 38:
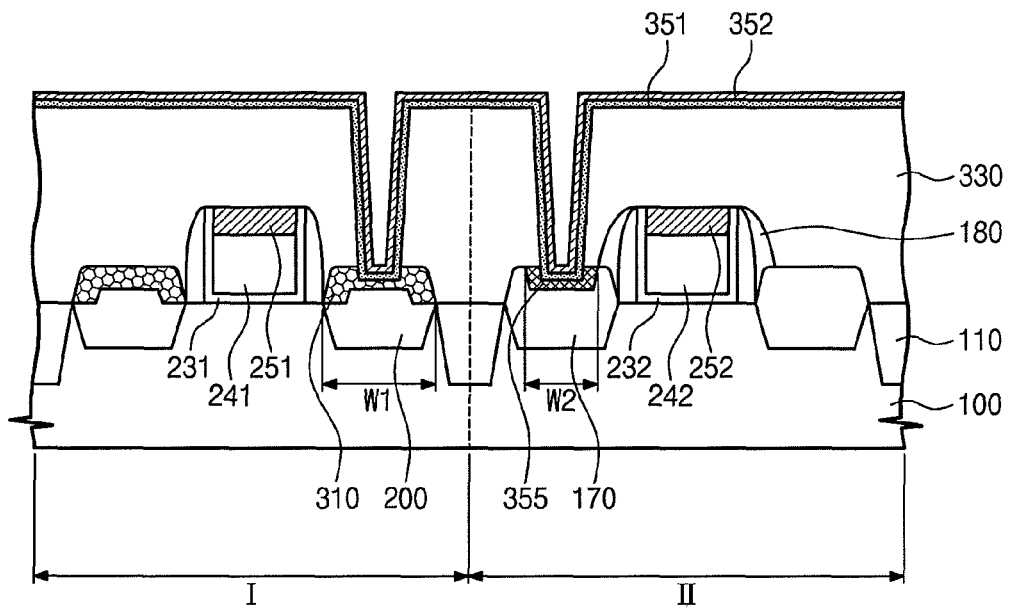

Referring to FIG. 38, a second metal silicide seed layer 351 may be formed on the inner sidewalls and at the bottoms of the first and second contact holes 341 and 342. A second metal silicide capping layer 352 may be formed on the second metal silicide seed layer 351. The second metal silicide seed layer 351 may comprise at least one metal element not existing in the first metal silicide seed layer 260. The second metal silicide seed layer 351 may comprise, for example, a titanium (Ti) layer and the second metal silicide capping layer 352 may comprise, for example, a titanium nitride (TiN) layer. A second metal silicide layer 355 may be formed at the bottom of the second contact hole 342 on the first epitaxial layer 170 in the second region II by performing a second heat-treatment process. The second metal silicide layer 355 may comprise, for example, a titanium silicon compound (TiSi). During this process step, the second silicide layer 355 may not be formed on the first metal silicide layer 310 in the first region I because the first metal silicide layer 310, for example, a nickel platinum silicon compound (NiPtSi) or a nickel cobalt silicon compound (NiCoSi), is already a stable compound. A first width W1 of the first metal silicide layer 310 may be wider than the second width W2 of the second metal silicide layer 355.

Figure 39:
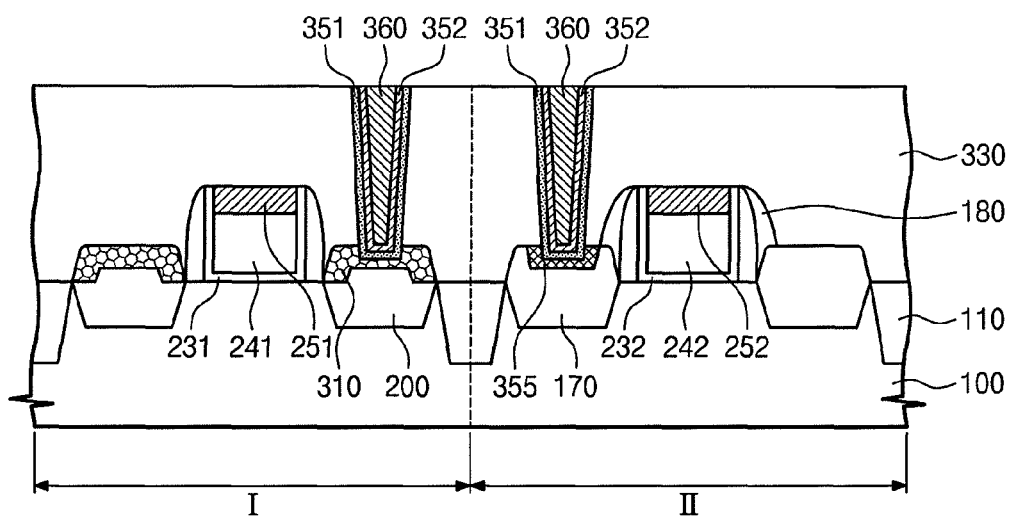

Referring to FIG. 39, a contact plug 360 may be on the second metal silicide capping layer 352 in the first or second contact holes 341 and 342. The contact plug 360 may comprise tungsten (W) that is planarized by a CMP process to expose the upper surface of the second interlayer dielectric layer 330.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description. For example, the present inventive concepts may apply to a fin field effect transistor (FinFET) process.

What is claimed is:

1. A semiconductor device, comprising:
   a substrate having first and second regions;
   a first metal gate electrode on the substrate in the first region;
   a second metal gate electrode on the substrate in the second region;
   a gate dielectric layer between the first and second metal gate electrodes and the substrate;
   a first epitaxial layer on and in the substrate at both sides of the first metal gate electrode;
   a second epitaxial layer on and in the substrate at both sides of the second metal gate electrode;
   a first metal silicide layer having a first width on the first epitaxial layer;
   a second metal silicide layer having a second width on the second epitaxial layer;
   an interlayer dielectric layer on the first and second metal silicide layers;
   a first contact plug passing through the interlayer dielectric layer and electrically connected to the first metal silicide layer;
   a second contact plug passing through the interlayer dielectric layer and electrically connected to the second metal silicide layer;
   a barrier metal layer between the first contact plug and the first metal silicide layer; and
   wherein the first metal silicide layer has at least one metal element which is different from that in the second metal silicide layer,
   wherein the first epitaxial layer includes germanium (Ge), and
   wherein germanium (Ge) is absent from the second epitaxial layer.

2. The semiconductor device of claim 1, wherein the first region is a PMOS transistor region and the second region is a NMOS transistor region.

3. The semiconductor device of claim 1, wherein the gate dielectric layer comprises at least one of hafnium (Hf), zirconium (Zr), and lanthanum (La); and
   wherein the first and second metal gate electrode layers comrpises at least one of titanium (Ti), titanium nitride (TiN), tantalum (Ta), tantalum nitride (TaN), tantalum aluminum carbon compound (TaAlC), tungsten (W), copper (Cu), and aluminum (Al).

4. The semiconductor device of claim 1, further comprising:
   a first metal gate electrode capping layer on the first metal gate electrode; and
   a second metal gate electrode capping layer on the second metal gate electrode,
   wherein the first and second metal gate electrodes capping layers comprises at least one of a silicon carbon (SiC) layer, a silicon carbon nitride (SiCN) layer, a silicon carbon oxynitride (SiCON) layer, a silicon oxynitride (SiON) layer, and a silicon nitride (SiN) layer.

5. The semiconductor device of claim 4, further comprising an etch stop layer between the interlayer dielectric layer and the first and second metal silicide layer.

6. The semiconductor device of claim 1, wherein the uppermost surface of the first epitaxial layer is at a higher level than the uppermost surface of the substrate adjacent the first epitaxial layer.

7. The semiconductor device of claim 1, wherein the first epitaxial layer has three portions comprising:
- a lower portion comprising silicon (Si), boron (B), and germanium (Ge);
- a middle portion comprising silicon (Si) and germanium (Ge); and
- an upper portion comprising silicon (Si).

8. The semiconductor device of claim 1, wherein the first metal silicide layer comprises at least one of nickel (Ni), platinum (Pt), and cobalt (Co), and wherein the second metal silicide layer comprises titanium (Ti).

9. The semiconductor device of claim 8, wherein the first metal silicide layer comprises at least one of a nickel platinum silicon compound (NiPtSi) and a nickel cobalt silicon compound (NiCoSi),
wherein the second metal silicide layer comprises a titanium silicon compound (TiSi).

10. The semiconductor device of claim 1, further comprising gate spacers on sidewalls of the first and second metal gate electrodes.

11. The semiconductor device of claim 1, wherein the second width of the second metal silicide layer is narrower than the first width of the first metal silicide layer.

12. The semiconductor device of claim 1, wherein the second epitaxial layer has at least one element which is different from that in the first epitaxial layer.

* * * * *